United States Patent
Takahashi

(10) Patent No.: US 6,724,664 B2
(45) Date of Patent: Apr. 20, 2004

(54) LOW-AMPLITUDE DRIVER CIRCUIT

(75) Inventor: Hiroyuki Takahashi, Tokyo (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 10/223,807

(22) Filed: Aug. 20, 2002

(65) Prior Publication Data

US 2002/0196058 A1 Dec. 26, 2002

Related U.S. Application Data

(62) Division of application No. 09/584,133, filed on May 31, 2000, now Pat. No. 6,603,334.

(30) Foreign Application Priority Data

Jun. 1, 1999 (JP) .............................................. 11-153260

(51) Int. Cl.[7] .............................................. H03B 1/00
(52) U.S. Cl. .......................... 365/189.05; 365/189.09; 365/189.11; 327/108; 327/112
(58) Field of Search ....................... 365/189.05, 189.09, 365/189.11; 327/108.112

(56) References Cited

U.S. PATENT DOCUMENTS

| | | | |
|---|---|---|---|
| 5,041,738 A | 8/1991 | Walters, Jr. | |
| 5,223,751 A | 6/1993 | Simmons et al. | |
| 5,382,843 A | 1/1995 | Gucyski | |
| 5,402,081 A | 3/1995 | Wong et al. | |
| 5,680,068 A | 10/1997 | Oochi et al. | |
| 5,748,016 A | 5/1998 | Kurosawa | |
| 5,917,765 A | 6/1999 | Morishita et al. | |
| 5,936,896 A | 8/1999 | Cho et al. | |
| 5,969,543 A | * 10/1999 | Erickson et al. | ............... 326/83 |
| 5,973,535 A | 10/1999 | Shibata et al. | |
| 5,973,984 A | * 10/1999 | Nagaoka | ................ 365/230.03 |
| 6,194,945 B1 | 2/2001 | Bahramzadeh | |
| 6,229,296 B1 | 5/2001 | Duesman et al. | |
| 6,288,600 B1 | 9/2001 | Kadowaki et al. | |
| 6,339,357 B1 | 1/2002 | Yamasaki et al. | |
| 6,603,334 B1 * | 8/2003 | Takahashi | ................... 327/108 |
| 2002/0047166 A1 * | 4/2002 | Takahashi | ................... 257/390 |

FOREIGN PATENT DOCUMENTS

| | | |
|---|---|---|
| JP | 62-012996 | 1/1987 |
| JP | 9-200036 | 7/1997 |
| JP | 09-244776 | 9/1997 |
| JP | 09-270696 | 10/1997 |

* cited by examiner

*Primary Examiner*—Viet Q. Nguyen
(74) *Attorney, Agent, or Firm*—Katten Muchin Zavis Rosenman

(57) ABSTRACT

In a low-amplitude driver circuit of the present invention, a P-channel MOS transistor is provided between the output signal line to be driven and the internal power supply line, and control is performed so that this P-channel MOS transistor turns on when the low-amplitude driver circuit outputs a high level (Vcc-Vtn). As a result, the output signal line substantially does not float at or above Vcc-Vtn.

9 Claims, 11 Drawing Sheets

LOW-AMPLITUDE DRIVER CIRCUIT

CROSS REFERENCE TO RELATED APPLICATION

This is a Divisional Application of Application Ser. No. 09/584,133, filed on May 31, 2000 now U.S. Pat. No. 6,603,334.

BACKGROUND OF THE INVENTION

1. Field of the Invention

The present invention relates to a low-amplitude driver circuit and a semiconductor device including this, and more particularly relates to a low-amplitude driver circuit in which this output wiring and the output wiring of another driver circuit are adjacent, and a semiconductor device including this.

2. Description of the Related Art

Logic signals in a semiconductor chip generally have an amplitude with the ground potential (GND) as the minimum potential and the power supply potential (Vcc) as the maximum potential. In the case of signals with this kind of amplitude, if the later-stage circuit that receives these signals is a CMOS circuit (CMOS inverter, etc.), for example, then if the signal is at the ground potential (GND), P-channel MOS transistors in the CMOS circuit are turned on, and N-channel MOS transistors are turned off, and conversely, if the signal is at the power supply potential (Vcc), N-channel MOS transistors in the CMOS circuit are turned on, and P-channel MOS transistors are turned off.

However, if the later-stage circuit is not a CMOS circuit, but a circuit comprising transistors of one conduction type, such as N-channel MOS transistors for example, the logic signals supplied to this circuit need not necessarily have the kind of amplitude described above, and in this case it is sufficient to use the ground potential (GND) as the minimum potential and a potential lower than the power supply potential (Vcc-α) as the maximum potential. That is to say, if the later-stage circuit does not include P-channel MOS transistors, it is not necessary to use a potential (in this case Vcc) that will turn the circuit completely off. Rather, by using a low amplitude in this way, not only is signal inversion made faster, making the circuit suitable for high-speed operation, but charging and discharging due to signal inversion is also reduced, resulting in lower power consumption. Thus, if the later-stage circuit is not CMOS, but a circuit comprising N-channel MOS transistors, a low amplitude is often used for the logic signals to be supplied to this circuit.

FIG. 15 is a drawing showing this kind of low-amplitude driver circuit. In the figure, three low-amplitude driver circuits, 400-0, 400-1, and 400-2, are shown. As these three low-amplitude driver circuits 400-0, 400-1, and 400-2 have the same circuit configuration, the actual circuit configuration is shown only for low-amplitude driver circuit 400-1 in the center, and the circuit configuration is not shown for the other low-amplitude driver circuits, 400-0 and 400-2.

These low-amplitude driver circuits 400-0, 400-1, and 400-2 receive and buffer input signals IN0, IN1, and IN2, respectively, and supply low-amplitude output signals to output signal lines X0, X1, and X2. As shown in the example of low-amplitude driver circuit 400-1, the actual circuit configuration comprises inverters 406 and 408, and N-channel MOS transistors 402 and 404. The N-channel MOS transistors 402 and 404 are connected in series between the power supply potential (Vcc) and the ground potential (GND), and the output of inverter 408 and the output of inverter 406, respectively, are applied to their gates. The input signal IN1 supplied to inverter 406 is a logic signal with an amplitude from the power supply potential (Vcc) to the ground potential (GND).

As shown in FIG. 15, the output signal lines X0, X1, and X2 are mutually parallel, and placed adjacent to each other, and there are coupling capacitances Cc between them.

Next, the operation of the low-amplitude driver circuits shown in FIG. 15 will be described, taking the example of the low-amplitude driver circuit 400-1. First, when the input signal IN1 is at the ground potential (GND), N-channel MOS transistor 402 is turned off and N-channel MOS transistor 404 is turned on, and therefore the output signal line X1 is connected to the ground potential (GND) and its potential is same as the ground potential (GND). Next, when the input signal IN1 changes to the power supply potential (Vcc), N-channel MOS transistor 402 is turned on and the N-channel MOS transistor 404 is turned off. As a result, the potential of the output signal line X1 rises, but as the turned-on transistor 402 is of N-channel type, the potential only rises to Vcc-Vtn (where Vtn is the threshold voltage of the N-channel MOS transistor 402).

In this way, the low-amplitude driver circuit 400-1 buffers the received input signal IN1, and supplies an output signal with an amplitude from GND to Vcc-Vtn to the output signal line X1. The other low-amplitude driver circuits, 400-0 and 400-2, operate in the same way.

A low-amplitude driver circuit of this kind is described in Japanese Patent Laid-Open No. 9-200036.

However, since output signal lines X0 and X2 are placed adjacent to and on either side of output signal line X1, as shown in FIG. 15, there are coupling capacitances Cc between these lines. Therefore, the potential of output signal line X1 is affected by changes in the potential of output signal lines X0 and X2.

FIG. 16 shows this situation, illustrating the case where output signal lines X0 and X2 adjacent to output signal line X1 change from the low level (GND) to the high level (Vcc-Vtn) while output signal line X1 is at the high level (Vcc-Vtn). As shown in FIG. 16, when output signal lines X0 and X2 change from the low level (GND) to the high level (Vcc-Vtn), output signal line X1 is raised by the coupling capacitances Cc. As described above, since transistor 402 is of N-channel type, when output signal line X1 rises at or above Vcc-Vtn, N-channel MOS transistor 402 goes to the off state, and the potential of output signal line X1 raised by the coupling capacitances Cc no longer falls.

When output signal line X1 rises at or above Vcc-Vtn, when input signal IN1 changes to the ground potential (GND) and N-channel MOS transistor 404 changes to the on state, it takes time to lower output signal line X1 to the ground potential (GND), preventing high-speed operation and also increasing power consumption.

Further, if output signal line X1 is raised by a large amount, and exceeds the power supply potential (Vcc), for example, an unexpected high voltage will be applied to the later-stage circuit connected to output signal line X1, causing reliability problems including degradation of transistor characteristics or permanent damage.

In particular, there has been a continuing reduction in the semiconductor chip wiring rule in recent years, and the affect of coupling capacitances Cc between the output signal lines has been increasing year by year.

BRIEF SUMMARY OF THE INVENTION

The present invention therefore has as an object the provision of low-amplitude driver circuits wherein high-speed operation and low power consumption are secured, in particular, by preventing upward floating of output signal lines due to coupling capacitances Cc, and a semiconductor device that includes these.

A low-amplitude driver circuit according to the present invention is a low-amplitude driver circuit that is connected to a first and second power supply, and drives an output signal line in accordance with an input signal; comprising: first means for driving the above described output signal line to a prescribed potential between the potential of the above described first power supply and the potential of the above described second power supply when the above described input signal is at a first logic level, the above described first means being connected to said first power supply; second means for driving the above described output signal line to a the potential of the above described second power supply when the above described input signal is at a second logic level, the above described second means being connected to said second power supply; and third means for preventing fluctuation of the potential of the above described output signal line toward the potential of the above described first power supply as seen from the above described prescribed potential.

BRIEF DESCRIPTION OF THE DRAWINGS

This above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

With reference now to the attached drawings, low-amplitude driver circuits according to the embodiments of the present invention will be described in detail below. The low-amplitude driver circuits according to each embodiment are all integrated on a single semiconductor substrate (semiconductor chip).

Figure 1:
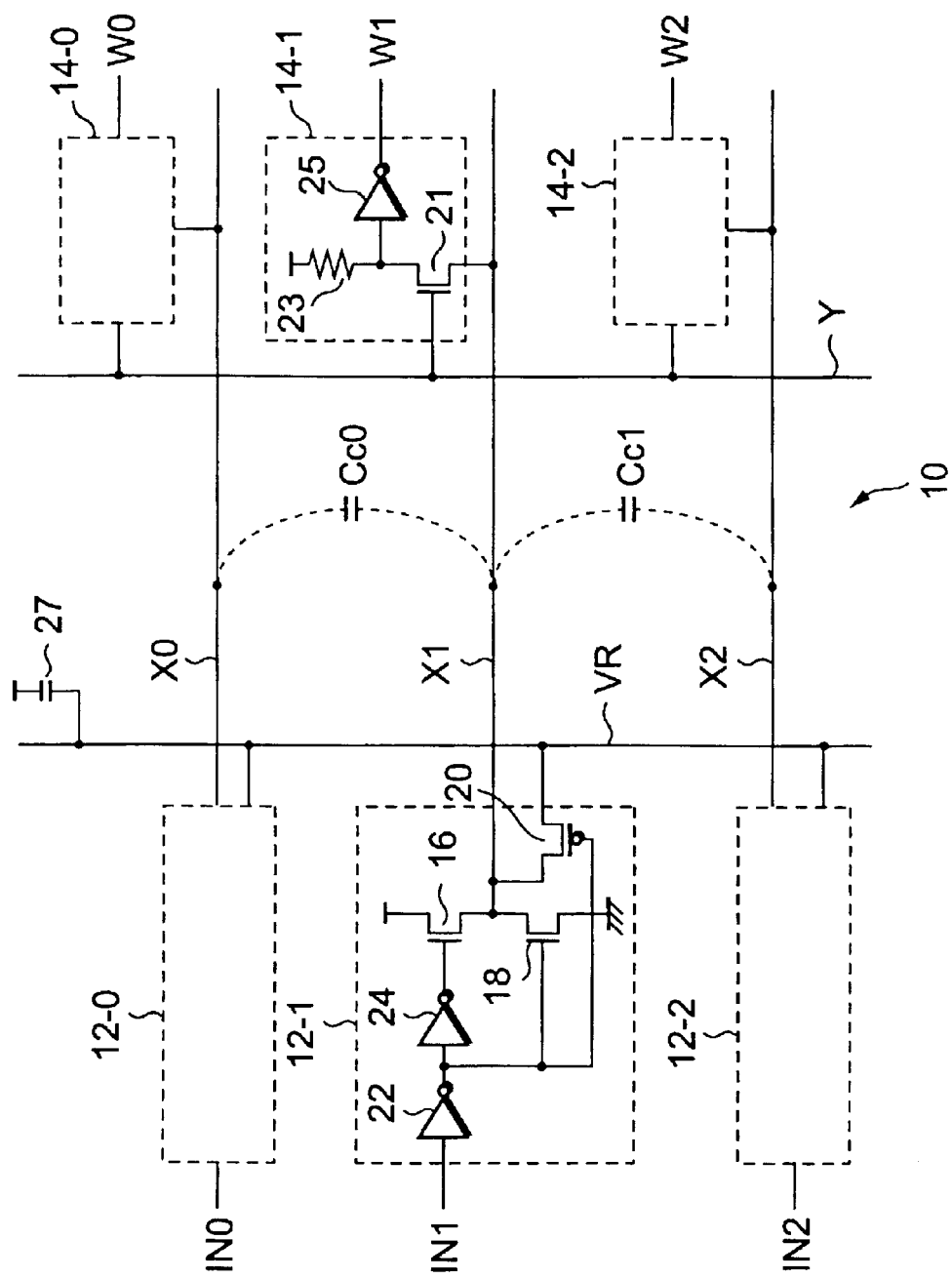
FIG. 1 is a circuit diagram showing a semiconductor device 10 according to the first embodiment of the present invention.

FIG. 1 is a drawing showing a semiconductor device 10 that includes low-amplitude driver circuits 12 according to the first embodiment of the present invention. In the figure, three low-amplitude driver circuits, 12-0, 12-1, and 12-2, are shown. As these three low-amplitude driver circuits 12-0, 12-1, and 12-2 have the same circuit configuration, the actual circuit configuration is shown only for low-amplitude driver circuit 12-1 in the center, and the circuit configuration is not shown for the other low-amplitude driver circuits, 12-0 and 12-2.

These low-amplitude driver circuits 12-0, 12-1, and 12-2 receive and buffer input signals IN0, IN1, and IN2, respectively, and supply low-amplitude output signals to output signal lines X0, X1, and X2. As shown in the example of low-amplitude driver circuit 12-1, the actual circuit configuration comprises inverters 22 and 24, N-channel MOS transistors 16 and 18, and a P-channel MOS transistor 20. The N-channel MOS transistors 16 and 18 are connected in series between the power supply potential (Vcc) and the ground potential (GND), and the output of inverter 24 and the output of inverter 22, respectively, are applied to their gates. The input signal IN1 supplied to inverter 22 is a logic signal with an amplitude from the power supply potential (Vcc) to the ground potential (GND).

Although there is no particular limitation, both the power supply potential (Vcc) and the ground potential (GND) are power supply potentials supplied from outside the semiconductor device (chip). The power supply potential (Vcc) can also be obtained from a voltage supplied from outside the semiconductor device and stepped down or stepped up inside the chip.

The P-channel MOS transistor 20 is connected between the output signal line X1 and the internal power supply line VR, and the output of inverter 22 is applied to its gate electrode.

The internal power supply line VR is also shared by the other low-amplitude driver circuits, 12-0 and 12-2. The capacitance 27 applied to the internal power supply line VR is a parasitic capacitance of the internal power supply line VR.

As shown in FIG. 1, the output signal lines X0, X1, and X2 are mutually parallel, and placed adjacent to each other, and there are coupling capacitances Cc0 and Cc1 between them. That is, the placement of the output signal lines X0, X1, and X2 in FIG. 1 is based on the actual placement on a semiconductor chip.

Decoder circuits 14-0, 14-1, and 14-2 are connected to output signal lines X0, X1, and X2, respectively, and output signal line Y is connected in common to these decoder circuits 14-0, 14-1, and 14-2. As these decoder circuits 14-0, 14-1, and 14-2 also have the same circuit configuration, only the circuit configuration of decoder circuit 14-1 is shown in FIG. 1.

As shown in FIG. 1, the decoder circuit 14-1 comprises a resistance 23 and an N-channel MOS transistor 21 connected in series between the power supply potential (Vcc) and output signal line X1, and an inverter 25 that has the point of connection of these components as its input side and supplies the output to an output signal line W. The gate electrode of the N-channel MOS transistor 21 is connected to output signal line Y.

Next, the operation of the low-amplitude driver circuits 12 and decoder circuits 14 shown in FIG. 1 will be described, taking the examples of low-amplitude driver circuit 12-1 and decoder circuit 14-1, respectively.

First, when the input signal IN1 is at the ground potential (GND), N-channel MOS transistor 16 and the P-channel MOS transistor 20 are turned off, and N-channel MOS transistor 18 is turned on, and therefore the output signal line X1 is connected to the ground potential (GND) and its potential is the same as the ground potential (GND). Next, when the input signal IN1 changes to the power supply potential (Vcc), N-channel MOS transistor 16 and the P-channel MOS transistor 20 are turned on, and N-channel MOS transistor 18 is turned off. As described in detail later, the potential of the internal power supply line VR is substantially maintained at Vcc-Vtn (where Vtn is the threshold voltage of N-channel MOS transistor 16). As a result, the potential of the output signal line X1 rises to Vcc-Vtn due to the turning on of N-channel MOS transistor 16 and the P-channel MOS transistor 20.

Because the transistor 16 is of N-channel type and the potential of the internal power supply line VR is Vcc-Vtn, the low-amplitude driver circuit 12-1 is not capable of raising the output signal line X1 at or above Vcc-Vtn. Therefore, the low-amplitude driver circuit 12-1 buffers the received input signal IN1, and supplies an output signal with an amplitude from GND to Vcc-Vtn to the output signal line X1. The other low-amplitude driver circuits, 12-0 and 12-2, also operate in the same way.

The decoder circuit 14-1 drives output signal line W to the high level (Vcc) when the potential of output signal line X1 is at the low level (GND) and the potential of output signal line Y is at the high level (Vcc or Vcc-Vtn), and drives output signal line W to the low level (GND) in other cases. In this way, in the decoder circuit 14-1, when output signal line X1 is at the low level, it is sufficient for its potential to be the ground potential (GND), and when at the high level, it is not necessary for its potential to rise to the power supply potential (Vcc), and therefore a low-amplitude driver circuit is used as the driver circuit 12-1 that drives output signal line X1. As has already been described, the advantages of using a low-amplitude driver circuit are that signal inversion is made faster, making the circuit suitable for high-speed operation, and charging and discharging due to signal inversion is also reduced, resulting in lower power consumption.

Next, the effect on output signal line X1 of potential fluctuations in the adjacent output signal lines X0 and X2 will be described with reference to FIG. 2.

Figure 2:
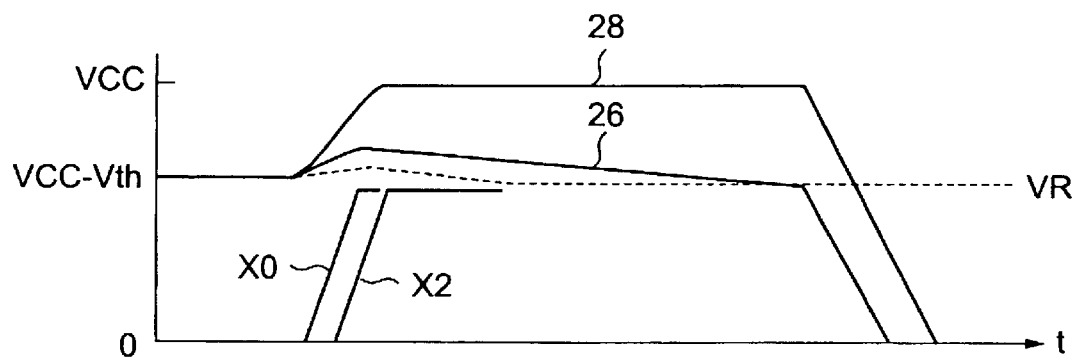
FIG. 2 is a graph explaining the effect of preventing upward floating of output signal lines according to the semiconductor device 10 shown in FIG. 1.

FIG. 2 shows the case where output signal lines X0 and X2 adjacent to output signal line X1 change from the low level (GND) to the high level (Vcc-Vtn) while output signal line X1 is at the high level (Vcc-Vtn). FIG. 2 shows the potential of output signal line X1 driven by the low-amplitude driver circuit 12-1 according to the present embodiment, denoted by reference number 26, and the potential of output signal line X1 driven by a conventional low-amplitude driver circuit 400-0, denoted by reference number 28, for comparison.

As shown in FIG. 2, when output signal lines X0 and X2 change from the low level (GND) to the high level (Vcc-Vtn), output signal line X1 tends to raise by the coupling capacitances Cc0 and Cc1. However, as the low-amplitude driver circuit 12-1 comprises a P-channel MOS transistor 20 connected to the internal power supply line VR, and this is turned on when output signal line X1 is being driven to the high level (Vcc-Vtn), output signal line X1 is connected to the internal power supply line VR. As a result, even though output signal line X1 tends to rise due to the coupling capacitances Cc0 and Cc1, the potential of output signal line X1 changes only slightly, and this change is absorbed by the internal power supply line VR, so that the potential of output signal line X1 converges toward Vcc-Vtn as shown in FIG. 2.

Thus, by using the low-amplitude driver circuit 12-1, even if adjacent other low-amplitude driver circuits 12-0 and 12-2 operate, output signal line X1 is not raised excessively due to this, and also gradually recovers from the slight degree of rise, so that the high-speed operation and low power consumption characteristic of low-amplitude driver circuits are secured and at the same time the next-stage circuit, the decoder circuit 14-1, does not suffer any loss of reliability.

The internal power supply line VR will now be described. As stated above, the potential of the internal power supply line VR is substantially maintained at Vcc-Vtn, but there is no need for special provision of a circuit to supply this potential to the internal power supply line VR. As shown in FIG. 1, a large number of low-amplitude driver circuits 12 are connected to the internal power supply line VR (FIG. 1 shows only three low-amplitude driver circuits, but this is not a limitation, and many more low-amplitude driver circuits 12 are connected on an actual semiconductor chip), and whenever these low-amplitude driver circuits 12 are driven to the high level, the Vcc-Vtn potential is supplied to the internal power supply line VR via the N-channel MOS transistor 16 and P-channel MOS transistor 20, and this is accumulated by a capacitance 27.

As stated above, the capacitance 27 is a parasitic capacitance, but it is also desirable for a special capacitive element to be connected to the internal power supply line VR. In this case, the capacitance of the internal power supply line VR is further increased, with the result that the stability of the potential of the internal power supply line VR is improved.

Moreover, although FIG. 2 illustrates the case where the two output signal lines X0 and X2 on either side of output signal line X1 both change from the low level (GND) to the high level (Vcc-Vtn), it goes without saying that a similar effect is also obtained if only one of output signal lines X0 and X2 changes from the low level (GND) to the high level (Vcc-Vtn). Similarly, the foregoing description has focused on an output signal line X1 positioned between two other output signal lines X0 and X2, but this is not a limitation, and a similar effect is also obtained for a terminal output signal line with an adjacent output signal line on only one side.

Now, as stated above, there is no need for special provision of a circuit to supply the Vcc-Vtn potential to the internal power supply line VR, but if, as a result of absorption of a large amount of potential from output signal lines X that have floated upward due to coupling capacitances Cc0 and Cc1, the potential of the internal power supply line VR itself is, conversely, raised at or above Vcc-Vtn, the effectiveness of preventing upward floating of the output signal lines X will be weakened. The potential of the internal power supply line VR falls due to the current flowing via the P-channel MOS transistor 20 when an output signal line X connected to it rises from the low level (GND) to the high level (Vcc-Vtn), but if this is not sufficient, the potential of the internal power supply line VR will gradually rise. Thus, it is desirable to add the separate compensation circuit 30 shown in FIG. 3 to the internal power supply line VR. However, the addition of a compensation circuit 30 is not essential to the present invention, and in a situation where the potential of the internal power supply line VR does not substantially rise at or above Vcc-Vtn through a potential drop due to the P-channel MOS transistor 20 or a potential drop due to leakage, this need not necessarily be added.

Figure 3:
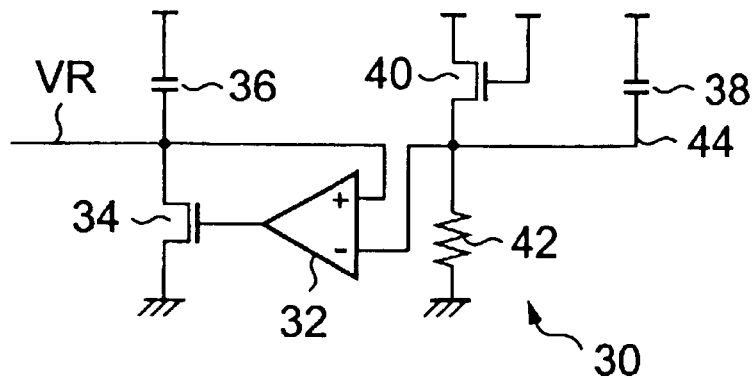
FIG. 3 is a circuit diagram of a compensation circuit 30.

As shown in FIG. 3, the compensation circuit 30 comprises an op-amp 32 with the non-inverse input pin connected to the internal power supply line VR and the inverse input pin connected to a nodal point 44; an N-channel MOS transistor 34 that is connected between the internal power supply line VR and the ground potential (GND), and receives the output of the op-amp 32 at its gate electrode; and a capacitance 36 connected between the power supply potential (Vcc) and the internal power supply line VP. The potential of the nodal point 44 is generated by a diode-connected N-channel MOS transistor 40, resistance 42, and capacitance 38.

The compensation circuit 30 is a circuit that restores the potential of the internal power supply line VR to Vcc-Vtn if it is raised at or above Vcc-Vtn. This operation is as follows. First, if an output signal line X floats upward, the potential of the internal power supply line VR that absorbs this tends to float upward, but this upward floating is first suppressed by the capacitance 36. If the potential still floats upward despite this, the op-amp 32 turns on the N-channel MOS transistor 34, extracts the charge on the internal power supply line VR, and forcibly lowers the potential. When the internal power supply line VR falls to Vcc-Vtn, the op-amp 32 turns off the N-channel MOS transistor 34, and so the potential of the internal power supply line VR does not fall any further. Thus, the addition of a compensation circuit 30 makes the potential of the internal power supply line VR extremely stable, and enables Vcc-Vtn to be maintained with a high degree of precision.

Figure 4:
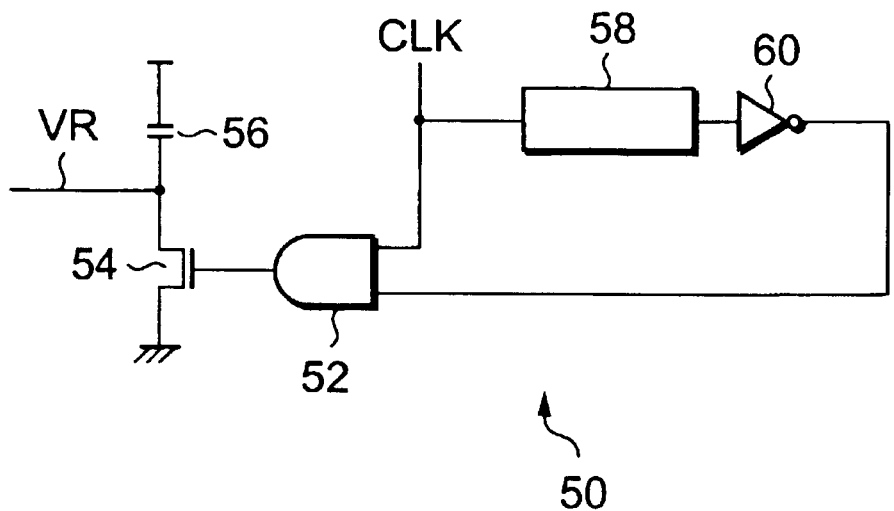
FIG. 4 is a circuit diagram of a compensation circuit 50.

Moreover, the compensation circuit 50 shown in FIG. 4 can also be used as the compensation circuit. This compensation circuit 50 is a circuit that periodically extracts the charge on the internal power supply line VR in response to a rising edge of the clock signal CLK, and comprises: a delay circuit 58 that delays the clock signal CLK; an inverter 60; an AND gate 52 that receives the clock signal CLK and the output of the inverter 60; and an N-channel MOS transistor 54 that receives the output of the AND gate 52 at its gate electrode. This compensation circuit 50 further comprises a capacitance 56 for stabilizing the potential of the internal power supply line VR.

This compensation circuit 50 is a circuit that turns on the N-channel MOS transistor 54 for a time determined by the delay amount of the delay circuit 58 and the delay amount of the inverter 60 each time the clock signal CLK rises from the low level to the high level, and achieves stabilization of the potential of the internal power supply line VR with a simple circuit configuration by periodically extracting the charge on the internal power supply line VR. Also, if the input signal IN supplied to the low-amplitude driver circuit 12 changes in response to the rise of the clock signal CLK, upward floating of the output signal line X also occurs in response to the rise of the clock signal CLK, and therefore the compensation circuit 50 extracts the charge when the potential of the internal power supply line VR is about to rise, providing an extremely effective method of stabilizing the potential of the internal power supply line VR using a simple circuit configuration.

Figure 5:
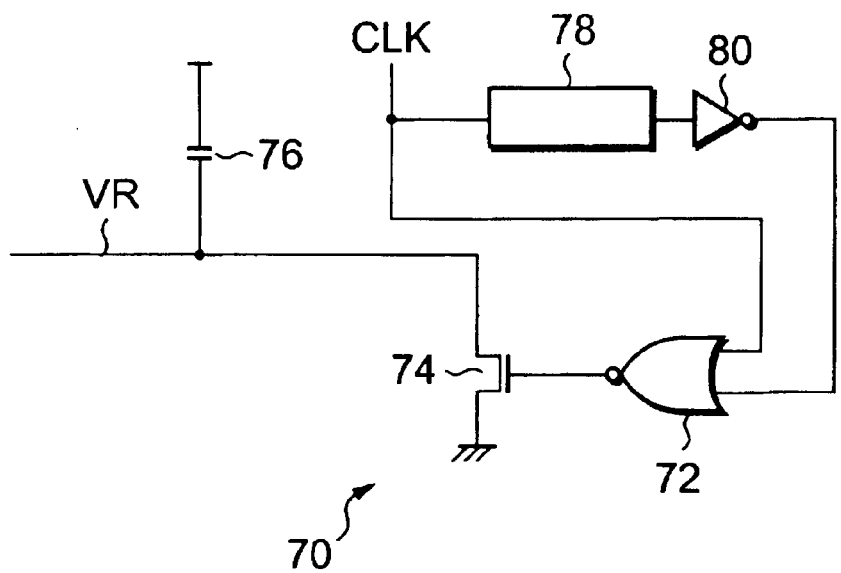
FIG. 5 is a circuit diagram of a compensation circuit 70.

Similarly, the compensation circuit 70 shown in FIG. 5 can also be used as the compensation circuit. Unlike compensation circuit 50, this compensation circuit 70 is a circuit that periodically extracts the charge on the internal power supply line VR in response to a falling edge of the clock signal CLK, and comprises: a delay circuit 78 that delays the clock signal CLK; an inverter 80; a NOR gate 72 that receives the clock signal CLK and the output of the inverter 80; and an N-channel MOS transistor 74 that receives the output of the NOR gate 72 at its gate electrode. The compensation circuit 70 further comprises a capacitance 76. This compensation circuit 70 is a circuit that turns on the N-channel MOS transistor 74 for a time determined by the delay amount of the delay circuit 78 and the delay amount of the inverter 80 each time the clock signal CLK falls from the high level to the low level, and is especially effective when the input signal IN supplied to the low-amplitude driver circuit 12 changes in response to the fall of the clock signal CLK.

Figure 6:
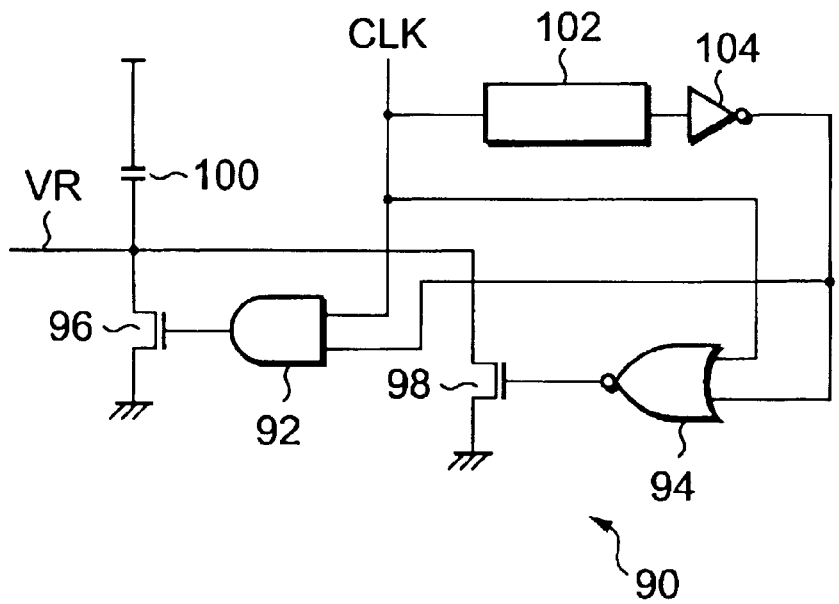
FIG. 6 is a circuit diagram of a compensation circuit 90.

Moreover, if the input signal IN supplied to the low-amplitude driver circuit 12 changes in response to both rises and falls of the clock signal CLK, or if it is not known whether IN changes in response to rises or in response to falls of CLK, use of the compensation circuit 90 shown in FIG. 6 is desirable. This compensation circuit 90 is a circuit combining compensation circuits 50 and 70, that extracts the charge on the internal power supply line VR at both the rise and fall of the clock signal CLK.

By using a low-amplitude driver circuit 12 according to the first embodiment and also adding a compensation circuit 30, 50, 70, or 90 to the internal power supply line VR, as described above, the stability of the potential of the internal power supply line VR is improved, and upward floating of the output signal line X is effectively suppressed.

Next, with reference to the attached drawings, a low-amplitude driver circuit 110 according to the second embodiment of the present invention will be described below.

Figure 7:
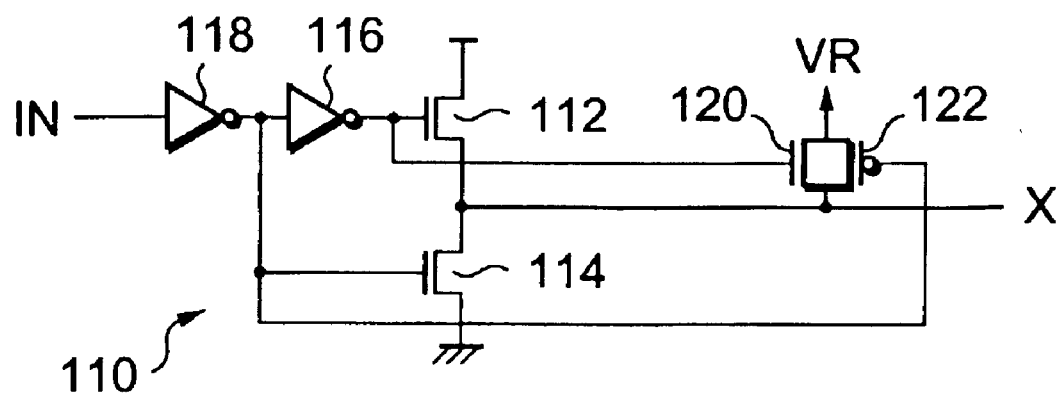
FIG. 7 is a circuit diagram showing a low-amplitude driver circuit 110 according to the second embodiment of the present invention.

FIG. 7 is a circuit diagram showing a low-amplitude driver circuit 110 according to the second embodiment of the present invention. The low-amplitude driver circuit 110 comprises inverters 116 and 118, N-channel MOS transistors 112, 114, and 120, and a P-channel MOS transistor 122. The N-channel MOS transistors 112 and 114 are connected in series between the power supply potential (Vcc) and the ground potential (GND), and the output of inverter 116 and the output of inverter 114, respectively, are applied to their gates. The input signal IN supplied to inverter 118 is a logic signal with an amplitude from the power supply potential (Vcc) to the ground potential (GND).

N-channel MOS transistor 120 and the P-channel MOS transistor 122 are connected between the output signal line X and the internal power supply line VR. The output of inverter 116 is applied to the gate electrode of N-channel MOS transistor 120, and the output of inverter 118 is applied to the gate electrode of the P-channel MOS transistor 122. Thus, the low-amplitude driver circuit 110 is a circuit in which an N-channel MOS transistor 120 has been added to the low-amplitude driver circuit 12 shown in FIG. 1.

The effect of adding this N-channel MOS transistor 120 is as follows. As transistor 120 is of N-channel type, it goes to the off state when the output signal line X is at the high level (Vcc-Vtn) and so has no effect of suppressing upward floating of the output signal line X, and prevention of upward floating of the output signal line X is achieved solely by the P-channel MOS transistor 122; however, when the potential of the output signal line X rises from the low level (GND) in response to a change in the input signal IN from the low level (GND) to the high level (Vcc-Vtn), N-channel MOS transistor 120 is turned on together with the P-channel MOS transistor 122, so that a current flows from the internal power supply line VR to the output signal line not only via the P-channel MOS transistor 122 but also via N-channel MOS transistor 120. Moreover, as transistor 120 is of N-channel type, its mobility is higher than that of the P-channel MOS transistor 122, and it draws in a greater amount of charge from the internal power supply line VR. As a result, the problem of the internal power supply line VR itself being raised at or above Vcc-Vtn is unlikely to arise, and in some cases, there will be no need at all for a compensation circuit 30, 50, 70, or 90 to be added to the internal power supply line VR. Of course, even when low-amplitude driver circuit 110 is used, it is desirable to add a compensation circuit 30, 50, 70, or 90 to the internal power supply line VR if the potential of the internal power supply line VR is raised at or above Vcc-Vtn.

Moreover, as the low-amplitude driver circuit 110 is driven via three transistors (112, 120, and 122), a further effect is a faster level change when the output signal line X changes from the low level (GND) to the high level (Vcc-Vtn).

Next, with reference to the attached drawings, a low-amplitude driver circuit 130 according to the third embodiment of the present invention will be described below.

Figure 8:
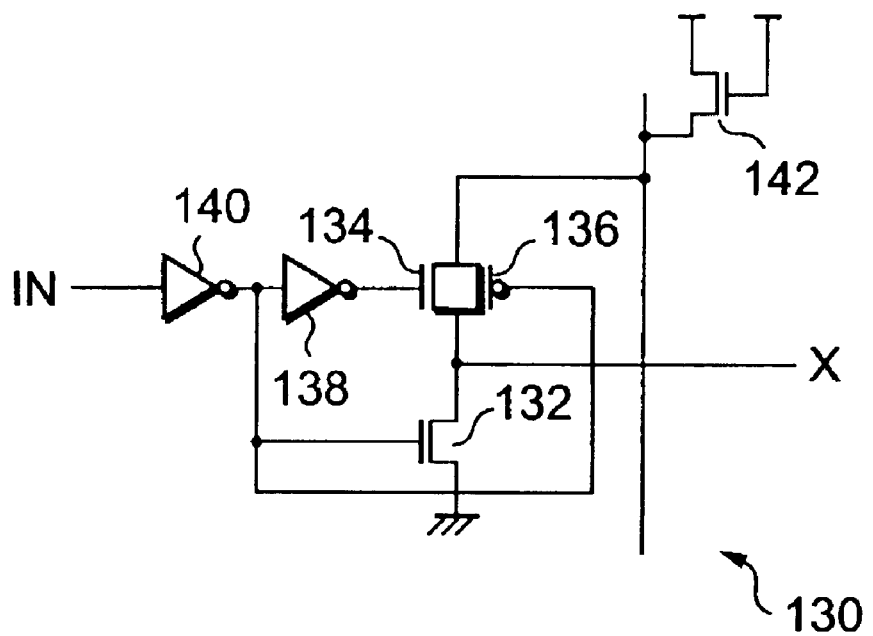
FIG. 8 is a circuit diagram showing a low-amplitude driver circuit 130 according to the third embodiment of the present invention.

FIG. 8 is a circuit diagram showing a low-amplitude driver circuit 130 according to the third embodiment of the present invention. The low-amplitude driver circuit 130 comprises inverters 138 and 140, N-channel MOS transistors 132 and 134, and a P-channel MOS transistor 136. N-channel MOS transistor 134 and the P-channel MOS transistor 136 are connected in parallel between the internal power supply line VR and the output signal line X. N-channel MOS transistor 132 is connected between the output signal line X and the ground potential (GND), and the output of inverter 140 is applied to its gate electrode. The output of inverter 138 and the output of inverter 140 are applied to the gate electrode of N-channel MOS transistor 134 and the gate electrode of the P-channel MOS transistor 136, respectively.

When such a low-amplitude driver circuit 130 is used, a diode-connected N-channel MOS transistor 142 must be added to the internal power supply line VR. That is to say, as changes of the output signal line X from the low level (GND) to the high level (Vcc-Vtn) are entirely performed via the internal power supply line VR, a means of pulling up the potential of the internal power supply line VR is necessary.

When using the low-amplitude driver circuit 130 shown in FIG. 8, since driving of the output signal line X to the high level (Vcc-Vtn) is entirely performed via the internal power supply line VR, upward floating of the potential of the internal power supply line VR at or above Vcc-Vtn scarcely ever occurs. As a result, in most cases, the internal power supply line VR can be maintained at Vcc-Vtn without adding a compensation circuit 30, 50, 70, or 90 to the internal power supply line VR. However, this does not prevent the addition of a compensation circuit 30, 50, 70, or 90 to the internal power supply line VR when using low-amplitude driver circuit 130.

When using low-amplitude driver circuit 130, since driving of the output signal line X to the high level (Vcc-Vtn) is entirely performed via the internal power supply line VR, and drive from the power supply potential (Vcc) is not performed, the rise speed of the output signal line X is lower than in the case of low-amplitude driver circuit 12 or 110. Therefore, low-amplitude driver circuit 130 is suitable for cases where not particularly high-speed operation is required, but it is wished to stabilize the potential of the internal power supply line VR using a simple configuration without providing a stabilization means such as compensation circuit 30.

Next, with reference to the attached drawings, a low-amplitude driver circuit 150 according to the fourth embodiment of the present invention will be described below.

Figure 9:
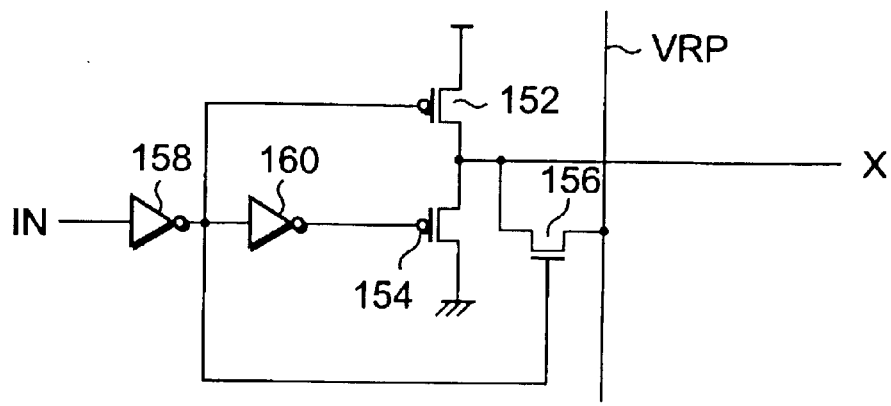
FIG. 9 is a circuit diagram showing a low-amplitude driver circuit 150 according to the fourth embodiment of the present invention.

FIG. 9 is a circuit diagram showing a low-amplitude driver circuit 150 according to the fourth embodiment of the present invention. The conduction types of the transistors used in this low-amplitude driver circuit 150 are all the reverse of those in low-amplitude driver circuit 12. The low-amplitude driver circuit 150 comprises inverters 158 and 160, P-channel MOS transistors 152 and 154, and an N-channel MOS transistor 156. The circuit operation is similar to that of low-amplitude driver circuit 12 shown in FIG. 1, and so a detailed description will be omitted here, but briefly, unlike internal power supply line VR, internal power supply line VRP is maintained at the threshold voltage high potential (Vtp) of P-channel MOS transistor 154 rather than the ground potential (GND), and when the output signal line X falls below Vtp due to the influence of coupling capacitances Cc0 and Cc1, a current flows from the internal power supply line VRP via the N-channel MOS transistor 156, and the potential of the output signal line X is maintained at Vtp.

Similarly, it is also possible to use a low-amplitude driver circuit with reversal of the conduction type of all the transistors that are components of low-amplitude driver circuit 110 or 130.

As, with a low-amplitude driver circuit with all these conduction types reversed, the output amplitude is Vtp to Vcc, and the later-stage circuit is composed of P-channel MOS transistors, this kind of low-amplitude driver circuit is used in cases where there is no need to drop the potential completely to the ground potential (GND). It is therefore possible to improve speed and reduce power consumption for the entire chip by mixing driver circuits with an output amplitude of GND to Vcc-Vtn, such as low-amplitude driver circuit 12, and driver circuits with an output amplitude of Vtp to Vcc, such as low-amplitude driver circuit 150, in a single semiconductor chip, according to the later-stage circuit configuration.

Next, with reference to FIG. 10, a semiconductor device according to the fifth embodiment of the present invention will be described below.

Figure 10:
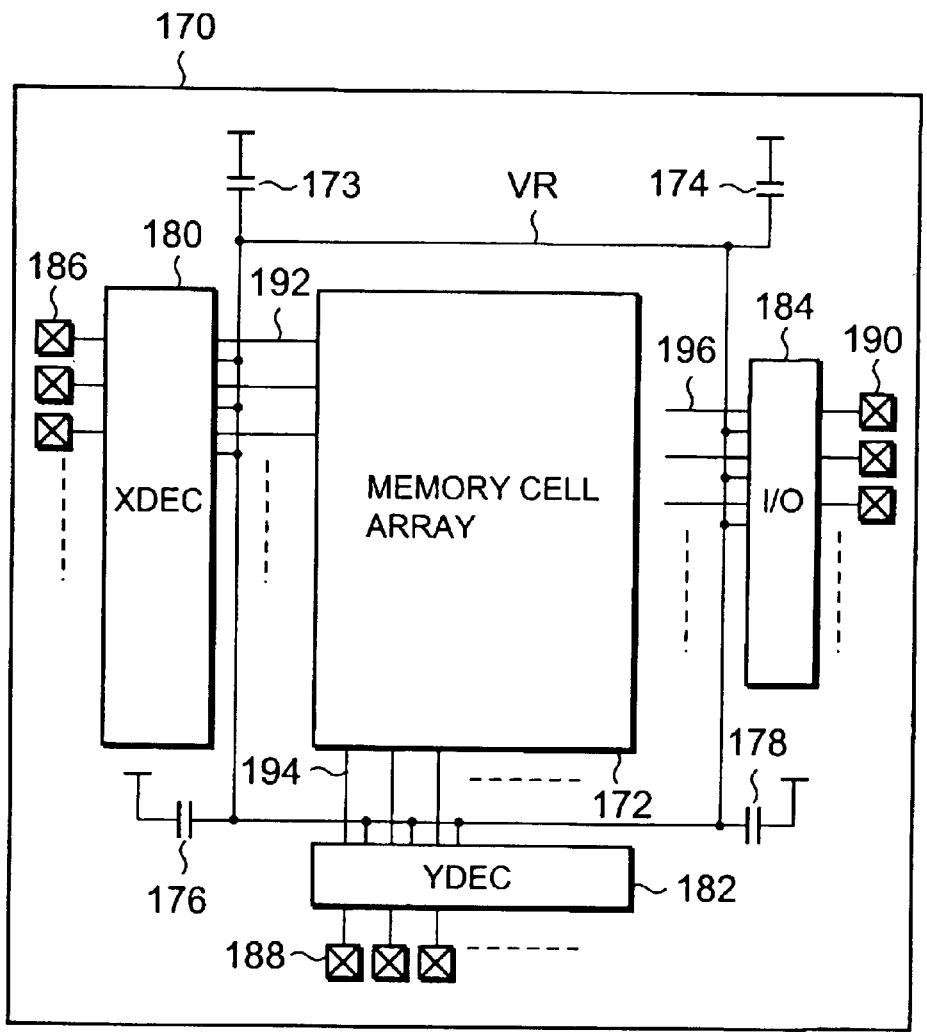
FIG. 10 is a circuit diagram showing semiconductor memory 170 according to the fifth embodiment of the present invention.

FIG. 10 is an example in which the low-amplitude driver circuits described above are applied to semiconductor memory 170. As shown in the figure, the semiconductor memory 170 has a memory cell array 172, an X decoder (XDEC) 180 that decodes X addresses applied to the X address pins 186, a Y decoder (YDEC) 182 that decodes Y addresses applied to the Y address pins 188, and an I/O circuit 184 whereby write data applied to the input/output pins 190 is supplied to the bus 196 and read data read onto the bus is output to the input/output pins 190. Of these, low-amplitude driver circuits according to the present invention apply to the X decoder (XDEC) 180, Y decoder (YDEC) 182, and I/O circuit 184.

The X decoder (XDEC) 180, for example, although there is no particular limitation, generates a large number of predecoded signals, etc., internally by means of division decoding, and these finally activate the prescribed word lines 192. Low-amplitude driver circuits according to the present invention can be used for driving various signals, such as the predecoded signals, in this process. Similarly, the Y decoder (YDEC) 182 decodes Y addresses applied to the Y address pins 188, and activates the prescribed column selection lines 194; and low-amplitude driver circuits according to the present invention can be used for driving various signals generated in this decoding process. Moreover, in the I/O circuit 184, also, low-amplitude driver circuits according to the present invention can be used when driving the bus 196 on the basis of write data applied to the input/output pins 190, and so forth.

As shown in FIG. 10, in the semiconductor memory 170, there is a shared internal power supply line VR that is connected to the low-amplitude driver circuits included in the X decoder (XDEC) 180, Y decoder (YDEC) 182, and I/O circuit 184. Consequently, the wiring of the internal power supply line VR follows a wide course so as to enclose the memory cell array 172, and its parasitic capacitance is extremely large, as shown by capacitances 173, 174, 176, and 178 in the figure. As a result, the potential of the internal power supply line VR is extremely stable. Moreover, as the internal power supply line VR is shared by the X decoder (XDEC) 180 and the I/O circuit 184, which are different kinds of circuit elements, the potential of the internal power supply line VR is mutually complemented by different circuit elements (as when, for example, an operation that causes the internal power supply line VR to float upward is performed by a particular circuit element, an operation that extracts the potential of the internal power supply line VR is performed by another circuit element), further increasing the stability of the internal power supply line VR.

With the semiconductor memory 170 shown in FIG. 10, also, special capacitance elements can be added to the internal power supply line VR. In addition, a compensation circuit 30, etc., can also be connected to the internal power supply line VR.

Moreover, the same type of low-amplitude driver circuit can be used for the X decoder (XDEC) 180, Y decoder (YDEC) 182, and I/O circuit 184, or different low-amplitude driver circuits can be used according to the purpose. For example, the low-amplitude driver circuit 12 shown in FIG. 1 can be used for all of these circuits—the X decoder (XDEC) 180, Y decoder (YDEC) 182, and I/O circuit 184—or the low-amplitude driver circuit 12 shown in FIG. 1 can be used for the X decoder (XDEC) 180 and the I/O circuit 184, and the low-amplitude driver circuit 130 shown in FIG. 8 for the Y decoder (YDEC) 182.

Low-amplitude driver circuits according to the present invention can also be used for circuits other than the X decoder (XDEC) 180, Y decoder (YDEC) 182, and I/O circuit 184, and the internal power supply line VR can also be shared by these circuits. Also, if, for layout related reasons, it is difficult for the internal power supply line VR to be shared by all the circuit elements for which low-amplitude driver circuits according to the present invention are used, it is not essential for it to be shared, but instead internal power supply lines VR can be shared by particular groups of circuit elements.

Next, with reference to the attached drawings, a low-amplitude driver circuit 200 according to the sixth embodiment of the present invention will be described below.

Figure 11:
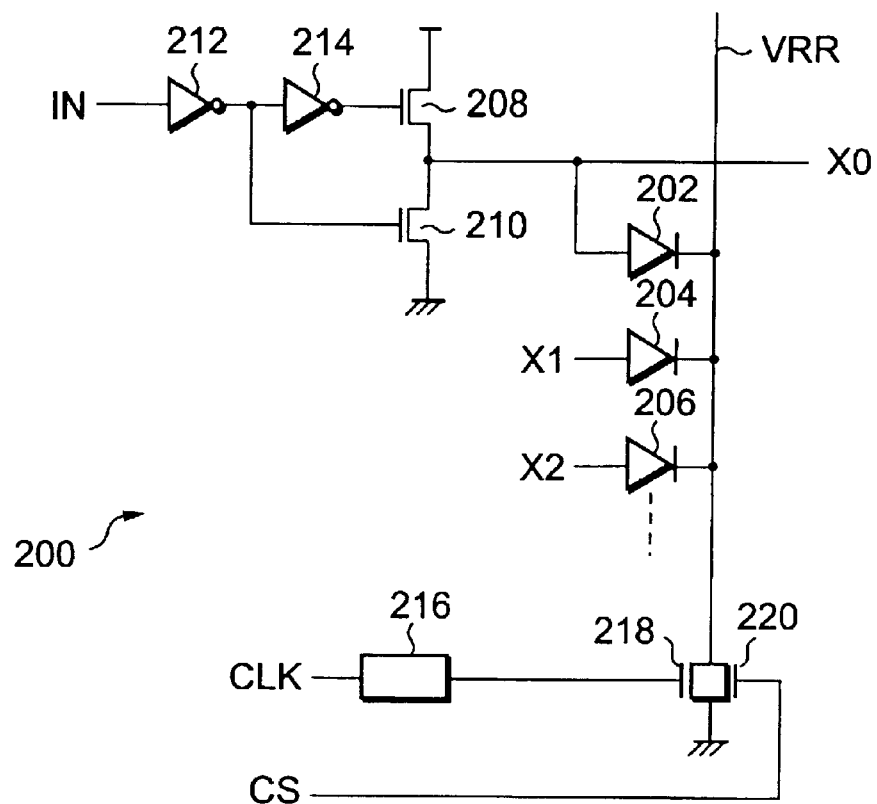
FIG. 11 is a circuit diagram showing a low-amplitude driver circuit 200 according to the sixth embodiment of the present invention.

FIG. 11 is a circuit diagram showing a low-amplitude driver circuit 200 according to the sixth embodiment of the present invention. The low-amplitude driver circuit 200 comprises inverters 212 and 214, N-channel MOS transistors 208 and 210, and a diode 202. N-channel MOS transistor 208 and N-channel MOS transistor 210 are connected in series between the power supply potential (Vcc) and the ground potential (GCD), their nodal point being the output signal line X0. The diode 202 is connected between the output signal line X0 and the internal power supply line VRR. The output of inverter 214 is applied to the gate electrode of N-channel MOS transistor 208, and the output of inverter 212 is applied to the gate electrode of N-channel MOS transistor 210.

Also connected to the internal power supply line VRR are diodes 204, 206, etc., which are components of other low-amplitude driver circuits. Diode 204, for example, is a component of a low-amplitude driver circuit corresponding to output signal line X1, and diode 206 is a component of a low-amplitude driver circuit corresponding to output signal line X2. As described later, the potential of the internal power supply line VRR is substantially held at Vcc-Vtn-Vf (where Vtn is the threshold voltage of N-channel MOS transistor 208, and Vf is the forward voltage of diode 202).

Also, as shown in FIG. 11, the internal power supply line VRR is connected to the ground potential (GND) via the N-channel MOS transistors 218 and 220. The output of a one-shot pulse generator 216 is applied to the gate electrode of N-channel MOS transistor 218, and a chip select signal CS is applied to the gate electrode of N-channel MOS transistor 220. In the present embodiment, the semiconductor chip is activated when the chip select signal CS is at the high level (active-high).

The one-shot pulse generator 216 receives the clock signal CLK, and generates a high-level one-shot pulse in response to a rising edge of this signal. Although there are no particular restrictions on the actual circuit configuration, this circuit comprises the AND gate 52, delay circuit 58, and inverter 60 shown in FIG. 4.

When low-amplitude driver circuit 200 is used, since the internal power supply line VRR is held at Vcc-Vtn-Vf, if the potential of the output signal line X0 tends to float upward due to the coupling capacitances, the potential of the output signal line X0 is held down to Vcc-Vtn by the current flowing through the diode 220.

The internal power supply line VRR will now be described. As stated above, the potential of the internal power supply line VRR is substantially held at Vcc-Vtn-Vf, but there is no need for special provision of a circuit to supply this potential to the internal power supply line VRR. This is because, as shown in FIG. 11, a large number of low-amplitude driver circuits 200 are connected to the internal power supply line VRR, and the relevant potential is supplied via N-channel MOS transistor 208 and the diode 202.

N-channel MOS transistors 218 and 220 are provided to form the current path of the diode 202, etc. That is, when the semiconductor chip is in the active state and it is necessary for the potential of the internal power supply line VRR to be made Vcc-Vtn-Vf, N-channel MOS transistor 220 is turned on by the high level of the chip select signal CS, and the current path of the diode 202, etc., is formed. When the semiconductor chip is in the inactive state and it is not necessary for the potential of the internal power supply line VRR to be made Vcc-Vtn-Vf, N-channel MOS transistor 220 is turned off by the low level of the chip select signal CS, the current path is cut, and power consumption is reduced. If there is little need to reduce power consumption when the semiconductor chip is unselected, N-channel MOS transistor 220 can be replaced with a resistance, so that the current path is formed continuously.

As N-channel MOS transistor 218 receives one-shot pulses generated at the rising edges of the clock signal CLK, as described above, it is turned on each time a clock signal rising edge arrives. As illustrated in FIG. 4, this kind of operation is effective when the input signal IN changes in response to the rise of the clock signal CLK; when the output signal line X is raised, the current path of the diode 202 is augmented, and the amount of current flowing along this path increases, making it possible to strongly suppress variations in the potential of the output signal line X, which tends to be raised due to the coupling capacitances.

Similarly, if the input signal IN changes in response to the fall of the clock signal CLK, it is possible to replace the one-shot pulse generator 216 with a circuit comprising the NOR gate 72, delay circuit 78, and inverter 80 shown in FIG. 5, and to use a circuit that generates high-level one-shot pulses in response to falling edges of the clock signal CLK. Also, if the input signal IN changes in response to both rises and falls of the clock signal CLK, or if it is not known whether IN changes in response to rises or in response to falls of CLK, it is possible to replace the one-shot pulse generator 216 with a circuit comprising the AND gate 92, NOR gate 94, delay circuit 102, and inverter 104 shown in FIG. 6, and to use a circuit that generates high-level one-shot pulses in response to both edges of the clock signal CLK.

However, the periodical turning-on of N-channel MOS transistor 218 in response to the one-shot pulse generator 216 is not essential in the present invention. That is to say, by providing this kind of circuit, when the output signal line X is about to float upward, the amount of current flowing in the diode 202, etc., increases and the stability of the internal power supply line VRR is raised, but if the internal power supply line VRR is comparatively stable even if the amount of current flowing in the diode 202, etc., is not increased at this time—that is, under conditions in which the internal power supply line VRR is stabilized solely by N-channel MOS transistor 218 which is constantly on during activation—then these circuits can be omitted. In other words, a configuration in which N-channel MOS transistors 218 and 220 are provided and these are turned on in response to the chip select signal CS and clock signal CLK is simply a preferred embodiment, and there is no obstacle to omitting either or both of these in the present invention.

Next, with reference to the attached drawings, a low-amplitude driver circuit 230 according to the seventh embodiment of the present invention will be described below.

Figure 12:
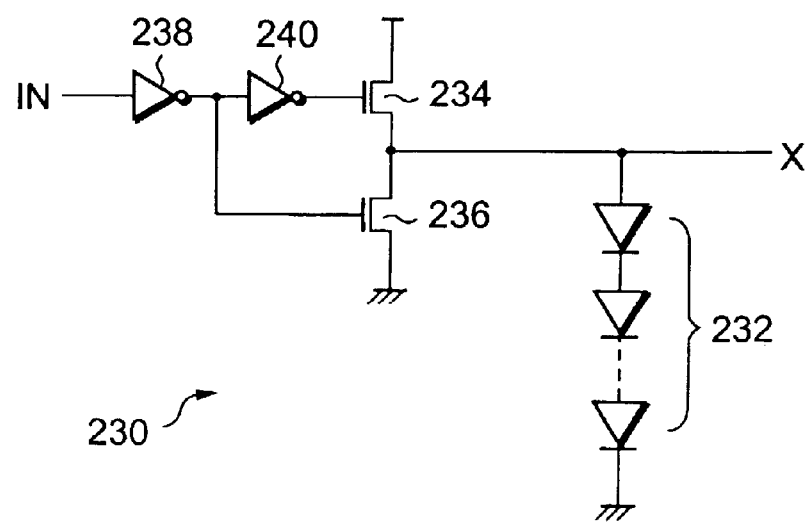
FIG. 12 is a circuit diagram showing a low-amplitude driver circuit 230 according to the seventh embodiment of the present invention.

FIG. 12 is a circuit diagram showing a low-amplitude driver circuit 230 according to the seventh embodiment of the present invention. The low-amplitude driver circuit 230 comprises inverters 238 and 240, N-channel MOS transistors 234 and 236, and a diode series 232. N-channel MOS transistor 234 and N-channel MOS transistor 236 are connected in series between the power supply potential (Vcc) and the ground potential (GND), their nodal point being the output signal line X. The diode series 232 is connected between the output signal line X and the internal power supply line VRR. The output of inverter 240 is applied to the gate electrode of N-channel MOS transistor 234, and the output of inverter 238 is applied to the gate electrode of N-channel MOS transistor 236.

The diode series 232 is a circuit in which n diodes are connected in series between the output signal line X and the ground potential (GND). If the forward voltage of one diode is Vf, when the output signal line X reaches at or above n×Vf, it turns on and its potential is clamped at n×Vf, thus preventing the output signal line X from floating upward due to the coupling capacitances, and its potential from exceeding n×Vf.

n×vf must be set higher than Vcc-Vtn, the high-level potential of the output signal line X. However, if n×Vf is set at too high a voltage, the output signal line X will begin to float upward significantly and its potential will be clamped, so that the effect of preventing floating will be weakened; while on the other hand, if n×vf is too low (if set to a voltage only slightly higher than Vcc-Vtn), the potential of the output signal line X will exceed n×Vf in the event of only a slight variation in the power supply potential (Vcc), and a through current will flow through N-channel MOS transistor 234 and the diode series 232, causing an increase in power consumption. Therefore, an appropriate voltage should be selected when setting n×Vf, the on voltage for the diode series 232, taking the above description into consideration.

An advantage of the use of this low-amplitude driver circuit 230 is that an internal power supply line VR (VRR) is not necessary.

Next, with reference to the attached drawings, a semiconductor device 250 according to the eighth embodiment of the present invention will be described below.

Figure 13:
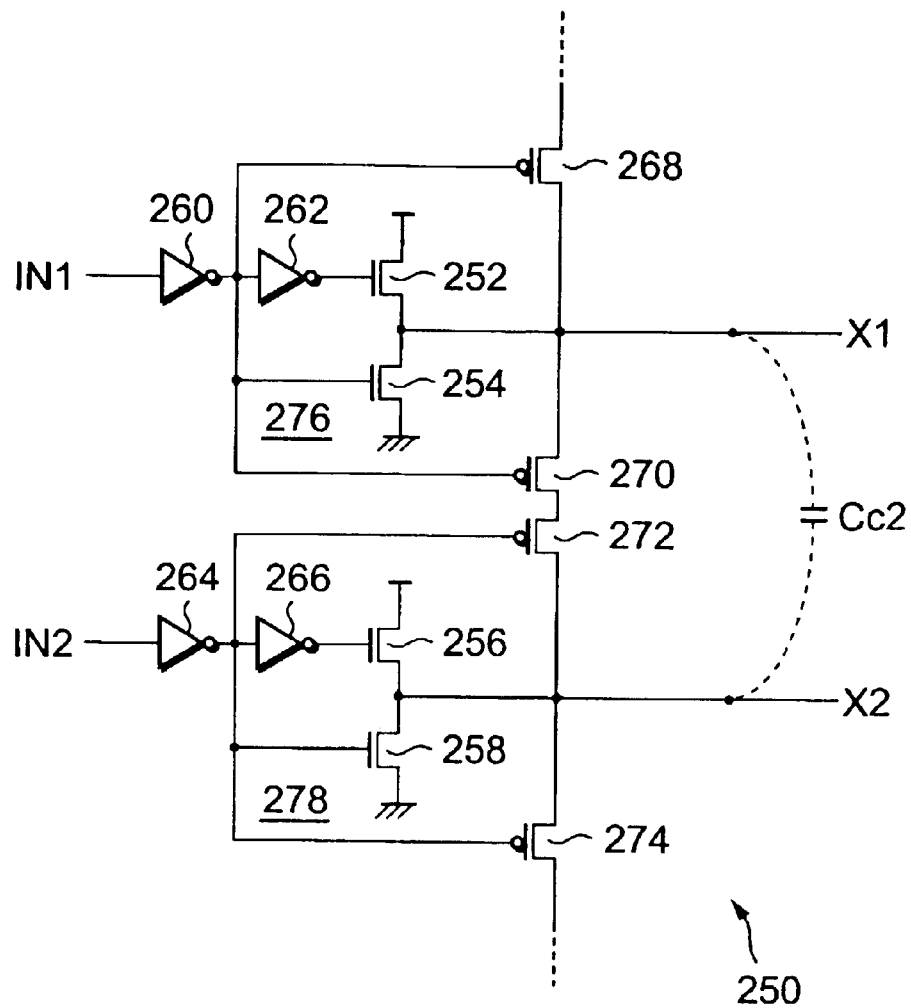
FIG. 13 is a circuit diagram showing a semiconductor device 250 according to the eighth embodiment of the present invention.

FIG. 13 is a circuit diagram showing a semiconductor device 250 according to the eighth embodiment of the present invention. As shown in FIG. 13, the semiconductor device 250 according to the present embodiment has low-amplitude driver circuits 276 and 278, which drive output signal lines X1 and X2, respectively. These output signal lines X1 and X2 are placed adjacent to each other, and the fact that the influence of fluctuation of the potential of one due to the coupling capacitance Cc2 appears in the other has already been described repeatedly. Although only two low-amplitude driver circuits, 276 and 278, are shown in FIG. 13 for the sake of convenience, the semiconductor device 250 in fact comprises many more low-amplitude driver circuits, and there is a coupling capacitance Cc2 between the numerous output signal lines X driven by these low-amplitude driver circuits.

Low-amplitude driver circuit 276 comprises inverters 260 and 262, and N-channel MOS transistors 252 and 254. N-channel MOS transistor 252 and N-channel MOS transistor 254 are connected in series between the power supply potential (Vcc) and the ground potential (GND), their nodal point being the output signal line X1. Similarly, low-amplitude driver circuit 278 comprises inverters 264 and 266, and N-channel MOS transistors 256 and 258. N-channel MOS transistor 256 and N-channel MOS transistor 258 are connected in series between the power supply potential (Vcc) and the ground potential (GND), their nodal point being the output signal line X2.

In addition, P-channel MOS transistors 270 and 272 are connected in series between output signal line X1 and output signal line X2. The gate electrode of P-channel MOS transistor 270 is connected to the output side of inverter 260 in low-amplitude driver circuit 276, and the gate electrode of P-channel MOS transistor 272 is connected to the output side of inverter 264 in low-amplitude driver circuit 278. Similarly, the other output signal lines X not shown are also connected via two P-channel MOS transistors connected in series, with the gate electrode of one of these P-channel MOS transistors connected to one low-amplitude driver circuit, and the gate electrode of the other P-channel MOS transistor connected to another low-amplitude driver circuit.

As P-channel MOS transistor 270 receives the output of inverter 260, it turns on when input signal IN1 is at the high level (Vcc), and as P-channel MOS transistor 272 receives the output of inverter 264, it turns on when input signal IN2 is at the high level (Vcc). That is to say, P-channel MOS transistor 270 turns on when output signal line X1 is driven to the high level (Vcc-Vtn), and P-channel MOS transistor 272 turns on when output signal line X2 is driven to the high level (Vcc-Vtn).

Therefore, output signal line X1 and output signal line X2 are placed in the connected state only when output signal line X1 and output signal line X2 are both at the high level (Vcc-Vtn).

Consequently, when, for example, input signal IN2 changes from the state in which output signal line X1 is at the high level (Vcc-Vtn) and output signal line 2 is at the low level (GND), and output signal line 2 shifts from the low level (GND) to the high level (Vcc-Vtn), both enter the connected state via the P-channel MOS transistors 270 and 272. For this reason, there is virtually no effect on output signal line X1 when output signal line X2 changes from the low level (GND) to the high level (Vcc-Vtn). Also, since these P-channel MOS transistors 270, etc., do not turn on unless both adjacent output signal lines X go to the high level (Vcc-Vtn), when both these output signal lines X are at another level, they have no effect at all on circuit operation.

Also, in the semiconductor device 250 according to the present embodiment, when not only two adjacent output signal lines X are connected, but three or more mutually adjacent output signal lines X go to the high level (Vcc-Vtn) and these output signal lines X are all connected in common, the parasitic capacitance of the commonly connected output signal lines X is extremely large, and so their potential is extremely stable.

Moreover, an advantage of the use of this semiconductor device 250 is that an internal power supply line VR (VRR) is not necessary.

Next, with reference to the attached drawings, a semiconductor device 280 according to the ninth embodiment of the present invention will be described below.

Figure 14:
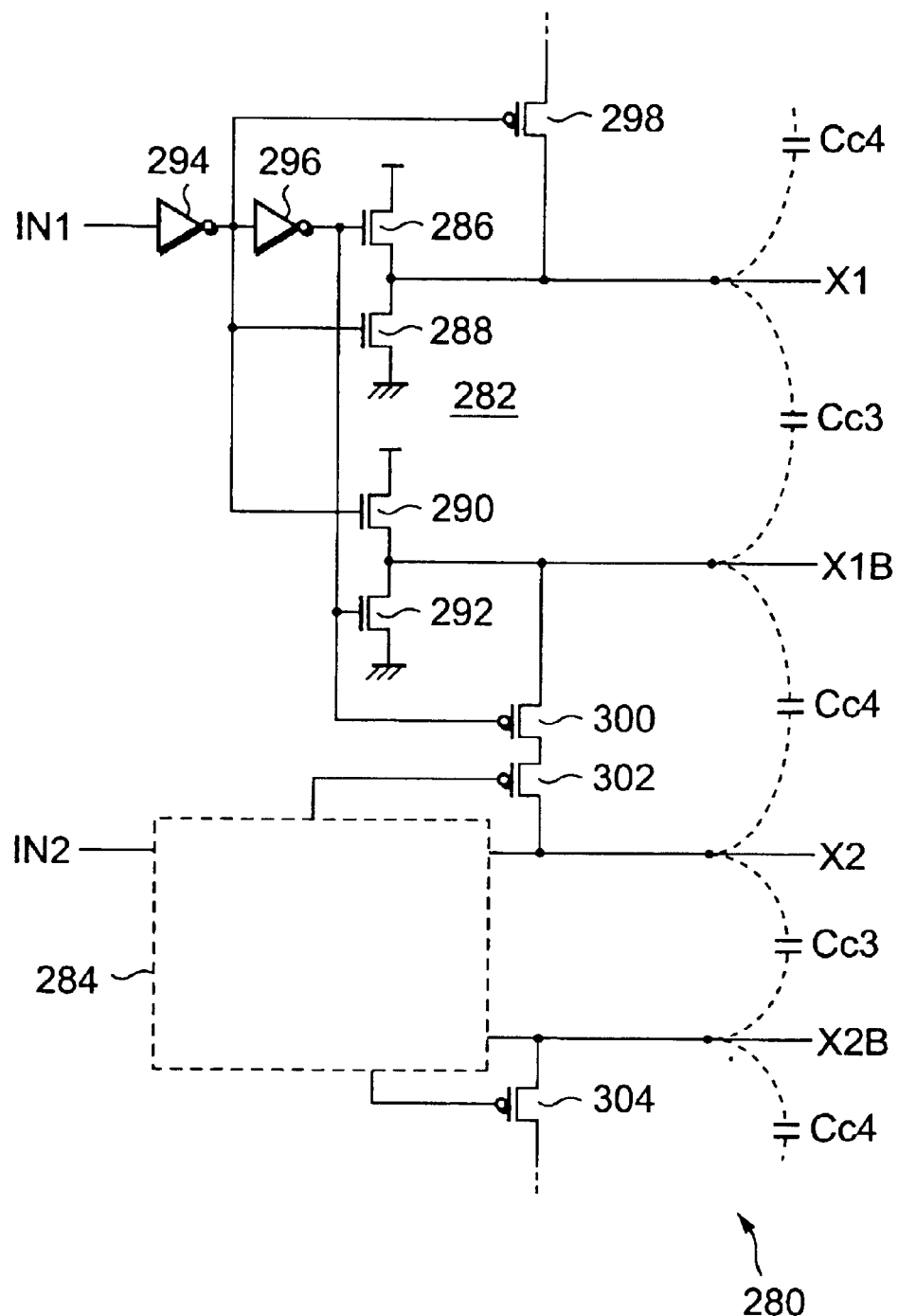
FIG. 14 is a circuit diagram showing a semiconductor device 280 according to the ninth embodiment of the present invention.
Figure 15:
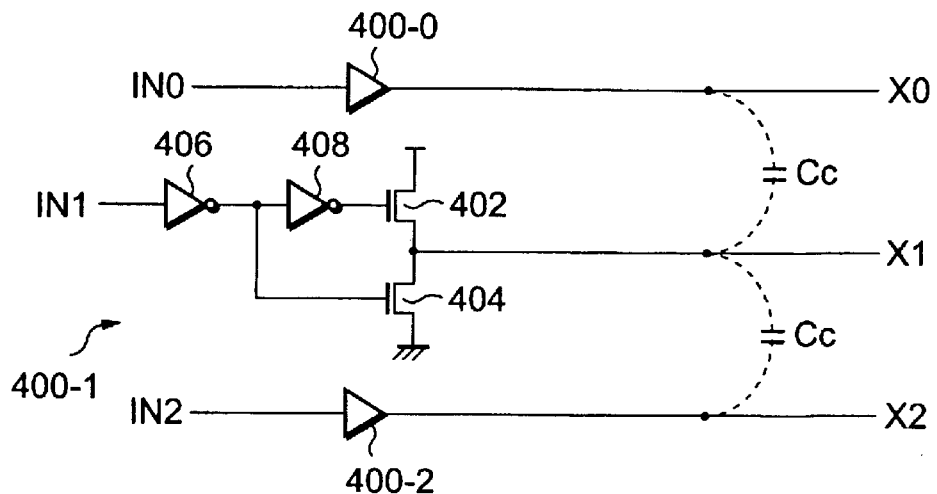
FIG. 15 is a circuit diagram showing a conventional low-amplitude driver circuit 400.
Figure 16:
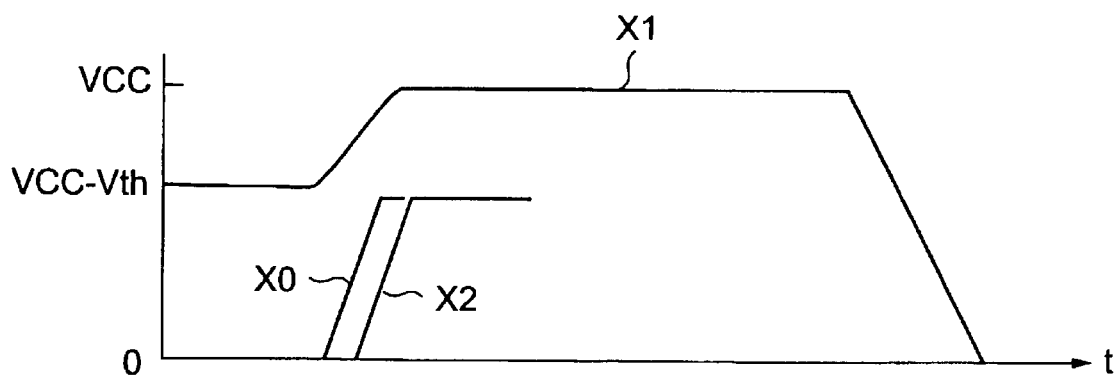
FIG. 16 is a graph illustrating the phenomenon of upward floating of an output signal line X in a conventional low-amplitude driver circuit 400.

FIG. 14 is a circuit diagram showing a semiconductor device 280 according to the ninth embodiment of the present invention. As shown in FIG. 14, the semiconductor device 280 according to the present embodiment has low-amplitude driver circuits 282 and 284, with low-amplitude driver circuit 282 driving output signal lines X1 and X1B, and low-amplitude driver circuit 284 driving output signal lines X2 and X2B. Output signal lines X1 and X1B are mutually complementary signals: when one is at the high level (Vcc-Vtn), the other is driven to the low level (GND). Similarly, output signal lines X2 and X2B are also mutually complementary signals.

Output signal line X1 and output signal line X1B, output signal line X1B and output signal line X2, and output signal line X2 and output signal line X2B are mutually adjacent, and there is a coupling capacitance Cc3 between output signal line X1 and output signal line X1B and between output signal line X2 and output signal line X2B, and a coupling capacitance Cc4 between output signal line X1B and output signal line X2.

Although only two low-amplitude driver circuits, 282 and 284, are shown in FIG. 14 for the sake of convenience, the semiconductor device 280 in fact comprises many more low-amplitude driver circuits, and among the numerous output signal lines X and XB driven by these low-amplitude driver circuits, there is a coupling capacitance Cc3 between output signal lines which have a complementary relationship, such as output signal line X1 and output signal line X1B, and there is a coupling capacitance Cc4 between output signal lines driven by different low-amplitude driver circuits, such as output signal line XB1 and output signal line X2.

Low-amplitude driver circuit 282 comprises inverters 294 and 296, and N-channel MOS transistors 286, 288, 290, and 292. N-channel MOS transistor 286 and N-channel MOS transistor 288 are connected in series between the power supply potential (Vcc) and the ground potential (GND), their nodal point being output signal line X1. N-channel MOS transistor 290 and N-channel MOS transistor 292 are also connected in series between the power supply potential (Vcc) and the ground potential (GND), their nodal point being output signal line X1B.

Of these N-channel MOS transistors, the gate electrodes of N-channel MOS transistors 286 and 292 are connected to the output side of inverter 296, and the gate electrodes of N-channel MOS transistors 288 and 290 are connected to the output side of inverter 294.

Although the circuit diagram is not shown in the figure, low-amplitude driver circuit 284 also has a similar circuit configuration to low-amplitude driver circuit 282 described above.

In addition, in this semiconductor device 280, P-channel MOS transistors 300 and 302 are connected in series between output signal line X1B and output signal line X2. The gate electrode of P-channel MOS transistor 300 is connected to the output side of inverter 296 in low-amplitude driver circuit 282, and the gate electrode of P-channel MOS transistor 302 is connected to the output side of the inverter in low-amplitude driver circuit 284 (this inverter is not shown, but is an inverter in low-amplitude driver circuit 284 corresponding to inverter 294 in low-amplitude driver circuit 282).

Similarly, the other output signal lines X, and output signal lines XB driven by a different low-amplitude driver circuit, which are not shown, are also connected via two P-channel MOS transistors connected in series, with the gate electrode of one of these P-channel MOS transistors connected to one low-amplitude driver circuit, and the gate electrode of the other P-channel MOS transistor connected to another low-amplitude driver circuit. However, as shown in FIG. 14, there is no means for connection between output signal lines with a mutually complementary relationship, as in the case of output signal line X1 and output signal line X1B.

Next, the operation of the semiconductor device 280 will be described.

First, although there is a coupling capacitance Cc3 between output signal lines with a mutually complementary relationship, such as output signal line X1 and output signal line X1B, as mutually complementary signals are supplied to output signal line X1 and output signal line X1B, the potential of output signal line X1 or output signal line X1B does not float upward due to the influence of the coupling capacitance Cc3. However, output signal line X2 may shift to the high level (Vcc-Vtn) from the state in which output signal line X1B is at the high level and output signal line X2 is at the low level (GND). Similarly, output signal line X1B may shift to the high level (Vcc-Vtn) from the state in which output signal line X2 is at the high level and output signal line X1B is at the low level (GND).

Consequently, upward floating of output signal line X1B or output signal line X2 may occur due to the influence of the coupling capacitance Cc4 between output signal line X1B and output signal line X2.

Therefore, in this semiconductor device 280, when output signal line X1B and output signal line X2 both go to the high level (Vcc-Vtn), the P-channel MOS transistors 300 and 302 provided between these lines turn on, and both go to the connected state, thus suppressing upward floating.

Thus, in the semiconductor device 280 according to the present embodiment, means is provided whereby, when an output signal line X (for example, output signal line X2) driven by one (for example low-amplitude driver circuit 284) of adjacent low-amplitude driver circuits (for example, 282 and 284) and an inverse output signal line XB (for example, output signal line X1B) driven by the other low-amplitude driver circuit (for example low-amplitude driver circuit 282) both go to the high level (Vcc-Vtn), both are connected; and therefore even with a type of low-amplitude driver circuit that drives complementary output signal lines, their potential does not float upward due to the influence of adjacent output signal lines.

Also, since these P-channel MOS transistors 300, etc., do not turn on unless both adjacent output signal lines go to the high level (Vcc-Vtn), when both these output signal lines are at another level, they have no effect at all on circuit operation. Moreover, an advantage of the use of this semiconductor device 280 is that an internal power supply line VR (VRR) is not necessary.

Embodiments of the present invention have been described above, but the present invention is not limited to these, and various modifications are possible without departing from the object of the present invention. For example, in the semiconductor device 10 shown in FIG. 1, output signal line X1 has other adjacent output signal lines X0 and X2 on either side of it, but it is quite conceivable that the potential of output signal line X1 would float upward due to some cause or other even if there were no other output signal lines X adjacent to output signal line X1, and therefore the scope of the present invention should not be interpreted as being limited to low-amplitude driver circuits that have output signal lines X adjacent to each other.

Also, in low-amplitude driver circuit 12-1, for example, the input signal IN1 is applied to the gate electrode of the N-channel MOS transistor 16 via inverters 22 and 24, but the present invention is not limited to this, and a configuration is also possible whereby, for example, the input signal IN1 is applied directly to the gate electrode of the N-channel MOS transistor 16.

Further, MOS transistors are used for all the transistors in each embodiment, but the present invention is not limited to this, and bipolar transistors, for example, can also be used for some or all of these transistors.

As described above, according to the present invention, means is provided for suppressing upward floating of the potential of output signal lines, enabling the provision of a low-amplitude driver circuit wherein high-speed operation and low power consumption are secured, in particular, by preventing upward floating of output signal lines due to coupling capacitances Cc, and a semiconductor device that includes such circuits.

What is claimed is:

1. A semiconductor circuit comprising:

a plurality of signal lines;

an internal line; and a plurality of drivers, each of which is responsive to a corresponding one of input signals for driving a corresponding one of said signal lines; said drivers being operatively connected in common to said internal line so that each of said driver makes a current path between said internal line and a corresponding one of signal lines in response to said corresponding one of said input signals.

2. The semiconductor circuit as claimed in claim 1, wherein said internal line is connected to a capacitor.

3. The semiconductor circuit as claimed in claim 1, wherein said input signals amplify with a first amplitude and said driver drives said signal line with a second amplitude narrower than said first amplitude.

4. The semiconductor circuit as claimed in claim 3, wherein said driver includes first and second transistors of a first conductivity type coupled in series between a first power source line and a second power source line and a third transistor of a second conductivity type coupled between said internal line and said signal line.

5. The semiconductor circuit as claimed in claim 3, wherein said first transistor receives a first level of said input signal and said second transistor receives a second level of said input signal when said third transistor receives said second level of said input signal.

6. The semiconductor circuit as claimed in claim 1, said circuit further comprising: a compensation circuit for maintaining said second amplitude.

7. The semiconductor circuit as claimed in claim 1, wherein said compensation circuit includes a capacitor coupled between a first power source line and said internal line and a transistor coupled between said internal line and a second power source line.

8. The semiconductor circuit as claimed in claim 7, wherein said compensation circuit includes a comparator comparing a potential of said internal line and a constant potential to drive said transistor.

9. The semiconductor circuit as claimed in claim 7, said compensation circuit including a logical circuit driven by a clock signal to drive said transistor.

* * * * *